(12) United States Patent
Lin et al.

(10) Patent No.: US 10,950,689 B2
(45) Date of Patent: Mar. 16, 2021

(54) SEMICONDUCTOR DEVICE WITH A THROUGH-SUBSTRATE VIA HOLE HAVING THEREIN A CAPACITOR AND A THROUGH-SUBSTRATE VIA CONDUCTOR

(71) Applicant: Nanyang Technological University, Singapore (SG)

(72) Inventors: Ye Lin, Singapore (SG); Chuan Seng Tan, Singapore (SG)

(73) Assignee: Nanyang Technological University, Singapore (SG)

( * ) Notice: Subject to any disclaimer, the term of this patent is extended or adjusted under 35 U.S.C. 154(b) by 23 days.

(21) Appl. No.: 15/761,384

(22) PCT Filed: Sep. 21, 2016

(86) PCT No.: PCT/SG2016/050461
§ 371 (c)(1),
(2) Date: Mar. 19, 2018

(87) PCT Pub. No.: WO2017/052471
PCT Pub. Date: Mar. 30, 2017

(65) Prior Publication Data
US 2018/0269276 A1    Sep. 20, 2018

(30) Foreign Application Priority Data

Sep. 23, 2015  (SG) .............................. 10201507924S

(51) Int. Cl.
*H01L 27/10* (2006.01)
*H01L 29/66* (2006.01)
(Continued)

(52) U.S. Cl.
CPC ............ *H01L 28/92* (2013.01); *H01L 21/768* (2013.01); *H01L 23/481* (2013.01);
(Continued)

(58) Field of Classification Search
CPC ......... H01L 28/92; H01L 28/40; H01L 28/87; H01L 28/88; H01L 28/91; H01L 23/481;
(Continued)

(56) References Cited

U.S. PATENT DOCUMENTS 4,704,368 A * 11/1987 Goth .................... H01L 21/762
257/E21.545
5,521,111 A * 5/1996 Sato .................. H01L 27/10835
257/E21.008
(Continued)

FOREIGN PATENT DOCUMENTS

| CN | 102760710 | 10/2012 |
|---|---|---|
| CN | 105206421 | 12/2015 |

(Continued)

OTHER PUBLICATIONS

Klootwijk, J. H., et al., "Ultrahigh Capacitance Density for Multiple ALD-Grown MIM Capacitor Stacks in 3-D Silicon," *IEEE Electron Device Letters*, Jul. 2008, vol. 29(7), pp. 740-742.

*Primary Examiner* — Ida M Soward
(74) *Attorney, Agent, or Firm* — Womble Bond Dickinson (US) LLP

(57) ABSTRACT

A semiconductor device 100 comprising a substrate 102 having a through-substrate via hole 106, the through-substrate via hole 106 having formed therein: a first capacitor electrode layer 110*a* and a second capacitor electrode layer 110*b*, and a dielectric material layer 112 disposed between the first capacitor electrode layer 110*a* and the second capacitor electrode layer 110*b*; and a through-substrate via conductor 116. A method of forming a semiconductor device 100, the semiconductor device 100 comprising a through-substrate via hole 106, the method comprising forming, in the through-substrate via hole 106: a first capacitor electrode layer 110*a* and a second capacitor electrode layer 110*b*, and a dielectric material layer 112 disposed between the first (Continued)

capacitor electrode layer 110a and the second capacitor electrode layer 110b; and a through-substrate via conductor 116.

10 Claims, 11 Drawing Sheets

(51) Int. Cl.
*H01L 29/94* (2006.01)
*H01L 49/02* (2006.01)
*H01L 23/48* (2006.01)
*H01L 27/108* (2006.01)
*H01L 21/768* (2006.01)

(52) U.S. Cl.
CPC ........ *H01L 27/10823* (2013.01); *H01L 28/40* (2013.01); *H01L 28/87* (2013.01); *H01L 28/88* (2013.01); *H01L 28/91* (2013.01); *H01L 23/48* (2013.01); *H01L 28/90* (2013.01); *H01L 29/66181* (2013.01); *H01L 29/945* (2013.01)

(58) Field of Classification Search
CPC ............... H01L 27/10823; H01L 28/90; H01L 29/66181; H01L 29/945
See application file for complete search history.

(56) References Cited

U.S. PATENT DOCUMENTS

| | | | |
|---|---|---|---|
| 6,441,419 B1 | 8/2002 | Johnson et al. | |
| 6,605,551 B2* | 8/2003 | Wermer | H05K 1/115 257/763 |
| 6,844,581 B2* | 1/2005 | Sitaram | H01L 21/7687 257/295 |
| 6,897,508 B2* | 5/2005 | Sneh | H01L 27/10861 257/301 |
| 6,992,022 B2* | 1/2006 | Shimamoto | C23C 16/18 438/780 |
| 7,095,046 B2* | 8/2006 | Ishikawa | H01L 29/78633 257/40 |
| 7,561,410 B1* | 7/2009 | Lee | H01G 9/0029 361/523 |
| 7,589,394 B2* | 9/2009 | Kawano | H01L 23/49816 257/532 |
| 7,700,986 B2* | 4/2010 | Huang | H01L 21/4857 257/301 |
| 8,492,241 B2 | 7/2013 | Cheng et al. | |
| 8,525,296 B1* | 9/2013 | Lin | H01L 21/76898 257/532 |
| 8,536,678 B2* | 9/2013 | Nowak | H01L 21/76898 257/532 |
| 8,642,456 B2 | 2/2014 | Bartley et al. | |
| 8,674,423 B2* | 3/2014 | Collins | H01L 23/481 257/301 |
| 8,686,522 B2* | 4/2014 | Webb | H01L 28/10 257/421 |
| 8,749,019 B2* | 6/2014 | Fujii | H01L 21/76898 257/502 |
| 8,779,491 B2* | 7/2014 | Yang | H01L 25/0657 257/301 |
| 8,785,289 B2 | 7/2014 | Kim et al. | |
| 8,810,007 B2* | 8/2014 | Takano | H01L 23/49822 174/260 |
| 8,815,743 B2* | 8/2014 | Birner | H01L 21/76898 438/700 |
| 8,963,287 B1* | 2/2015 | Tian | H01L 28/40 257/532 |
| 9,006,717 B2* | 4/2015 | Kim | H01L 51/5271 257/40 |
| 9,024,406 B2* | 5/2015 | Churchwell | H01L 27/14609 257/443 |
| 9,082,783 B2* | 7/2015 | Yamawaki | H01L 27/10852 |
| 9,196,672 B2* | 11/2015 | Tran | H01L 28/40 |
| 9,224,796 B2* | 12/2015 | Colonna | H01L 28/40 |
| 9,691,684 B2* | 6/2017 | Park | H01L 23/481 |
| 9,691,840 B2* | 6/2017 | Su | H01L 21/76898 |
| 9,728,450 B2* | 8/2017 | Farooq | H01L 21/76898 |
| 9,786,581 B2* | 10/2017 | Kamgaing | H01L 23/481 |
| 9,793,065 B2* | 10/2017 | Casasanta, III | H02J 7/00 |
| 9,793,340 B2* | 10/2017 | Voiron | H01L 29/66181 |
| 9,911,689 B2* | 3/2018 | Lee | H01L 21/76898 |
| 10,229,866 B2* | 3/2019 | Chen | H01L 21/76898 |
| 2002/0102835 A1 | 8/2002 | Stucchi et al. | |
| 2009/0096001 A1* | 4/2009 | Ludwig | H01L 27/1087 257/303 |
| 2009/0159322 A1* | 6/2009 | Wu | H01G 9/012 174/260 |
| 2010/0164062 A1* | 7/2010 | Wang | H01L 21/76898 257/532 |
| 2011/0095435 A1 | 4/2011 | Volant et al. | |
| 2011/0303936 A1* | 12/2011 | Wu | H01L 33/62 257/98 |
| 2013/0127067 A1* | 5/2013 | Cheng | H01L 23/481 257/774 |
| 2013/0171772 A1* | 7/2013 | Lin | H01L 23/481 438/107 |
| 2013/0181326 A1 | 7/2013 | Cheng et al. | |
| 2014/0144681 A1* | 5/2014 | Pushparaj | C23C 28/34 174/257 |
| 2014/0339702 A1* | 11/2014 | Woychik | H01L 23/481 257/762 |
| 2015/0102464 A1* | 4/2015 | Kang | H01L 28/87 257/535 |

FOREIGN PATENT DOCUMENTS

JP 2011071372 A * 4/2011
KR 20120069797 A * 6/2012

* cited by examiner

SEMICONDUCTOR DEVICE WITH A THROUGH-SUBSTRATE VIA HOLE HAVING THEREIN A CAPACITOR AND A THROUGH-SUBSTRATE VIA CONDUCTOR

CROSS-REFERENCE TO RELATED APPLICATIONS

This application is a national stage filing under 35 U.S.C. 371 of PCT/SG2016/050461, filed Sep. 21, 2016, which claims priority from Singapore Patent Application No. 10201507924S, filed Sep. 23, 2015, which applications are hereby incorporated by reference in their entirety herein.

FIELD OF THE DISCLOSURE

The invention relates generally to semiconductor devices and methods of forming the same. More particularly, the invention relates to forming capacitor electrode and dielectric layers in a trench formed in a semi-conductor substrate and forming a through-substrate via conductor.

BACKGROUND

Through-substrate-via (TSV) technology is becoming a key enabler for 3-D chip stacking as well as 2.5D side-by-side integration techniques. It provides electrical interconnect between different chip (such as silicon chips) layers vertically. On-chip deep trench capacitors (DTCap) are widely used in advanced electronic systems for, for example, dynamic random access memory (DRAM) and voltage regulator applications, since they provide a high capacitance density. Fabricating through-substrate-via and deep trench capacitors can be both challenging and costly, since they can occupy much more die area compared to a modern metal-oxide-semiconductor field-effect transistor (MOSFET).

U.S. Pat. No. 8,492,241 B2 describes a method for simultaneously forming a through-substrate-via and a deep trench structure. A through-substrate-via and a deep trench capacitor or a deep trench isolation (DTI) are simultaneously formed on the same substrate by a single mask and a single reactive ion etching (RIE). The through-substrate-via trench is wider and deeper that the deep trench capacitor or deep trench isolation trench. The through-substrate-via and deep trench capacitor or deep trench isolation are formed with different dielectric materials on the trench sidewalls. The through-substrate-via and deep trench capacitor or deep trench isolation are perfectly aligned. Supposedly, the cost of fabricating both through-substrate-via and deep trench capacitor is reduced.

U.S. Pat. No. 8,785,289 B2 illustrates an integrated decoupling capacitor employing conductive through-substrate-vias. A capacitor in a semiconductor substrate employs a conductive through-substrate-via as an inner electrode and a columnar doped semiconductor region as an outer electrode. The capacitor provides a large decoupling capacitance in a small area, and does not impact circuit density or a Si 3D structural design. Additional conductive through-substrate-vias can be provided in the semiconductor substrate to provide electrical connection for power supplies and signal transmission there through. The capacitor has a lower inductance than a conventional array of capacitors having comparable capacitance, thereby enabling reduction of high frequency noise in the power supply system of stacked semiconductor chips. The high quality deep trench capacitor has electrical connections to both top and bottom layers.

U.S. Pat. No. 8,642,456 B2 implements semiconductor signal-capable capacitors with deep trench and through-substrate-via technologies. A deep trench N-well structure is formed and an implant is provided in the deep trench N-well structure with a through-substrate-via formed in a semiconductor chip. At least one angled implant is created around the through-substrate-via in a semiconductor chip. The through-substrate-via is surrounded with a dielectric layer and filled with a conducting material which forms one electrode of the capacitor. A connection is made to one implant forming a second electrode to the capacitor. The signal-capable capacitor based on through-substrate-via structure has more degree of freedom in terms of electrode connections.

United States Patent Publication No. 20130181326 A1 discloses an improved semiconductor capacitor and method of fabrication. A metal insulator metal (MIM) stack, comprising alternating first-type and second-type metal layers (each separated by dielectric) is formed in a deep cavity. The entire stack can be planarized, and then patterned to expose a first area, and selectively etched to recess all first metal layers within the first area. A second selective etch is performed to recess all second metal layers within a second area. The etched recesses can be backfilled with dielectric. Separate electrodes can be formed; a first electrode formed in said first area and contacting all of said second-type metal layers and none of said first-type metal layers, and a second electrode formed in said second area and contacting all of said first-type metal layers and none of said second-type metal layers.

SUMMARY OF THE INVENTION

The invention is defined in the independent claims. Some optional features of the invention are defined in the dependent claims.

As disclosed herein, techniques are proposed and described which may allow co-fabrication of both a capacitor and a TSV in a seam-less manner.

Advantages over the known techniques cited above may include one or more of the following:
Given that the capacitor electrodes and the TSV conductor occupy the same trench/through-substrate via hole, these may occupy significantly less die area; their footprint(s) may be significantly smaller.
The techniques disclosed herein are not limited in respect of no separated input-output (I/O) signal transfer being possible, as is the case with some of the prior art techniques.
The techniques disclosed herein may be less complex and difficult to control. Moreover, the disclosed techniques, not having a particularly wide structure, may be beneficial in that the compactness and density of the through-substrate-via array is not so limited.

Implementation of the techniques disclosed herein may provide significant technical benefits. For instance, a trench structure, such as a deep trench structure, may be formed within a semiconductor substrate. A capacitor may be built within the through-substrate-via hole in which a through-substrate via conductor is also disposed. In at least one implementation, the capacitor is a multi-layer metal-insulator-metal (MIM) capacitor. This proposed structure may combine the trench capacitor and the through-substrate-via together in one trench/via hole, but may keep the two terminal electrodes of the through-substrate-via conductor and the deep trench capacitor separated. Thus, both the deep trench capacitor and the through-substrate-via can function independently.

Further advantages from implementation of the techniques disclosed herein include the following.

There may be cost reduction. By simplifying process flows for the forming of DTCaps and TSVs, fewer masks and processing steps may be required. Die area is used optimally when combining techniques which, hitherto, have required two trenches.

There may be better thermo-mechanical reliability. In situations where more buffering layers are provided in between the substrate and TSV conductor e.g. the conductor core, the thermo-mechanical stress can be mitigated. Thermo-mechanical stress may be introduced in the process of TSV. In this case, TSV with partially filled copper can mitigate stress level as well.

BRIEF DESCRIPTION OF THE FIGURES

The invention will now be described, by way of example only, and with reference to the accompanying drawings in which.

DETAILED DESCRIPTION OF THE INVENTION

Figure 1:
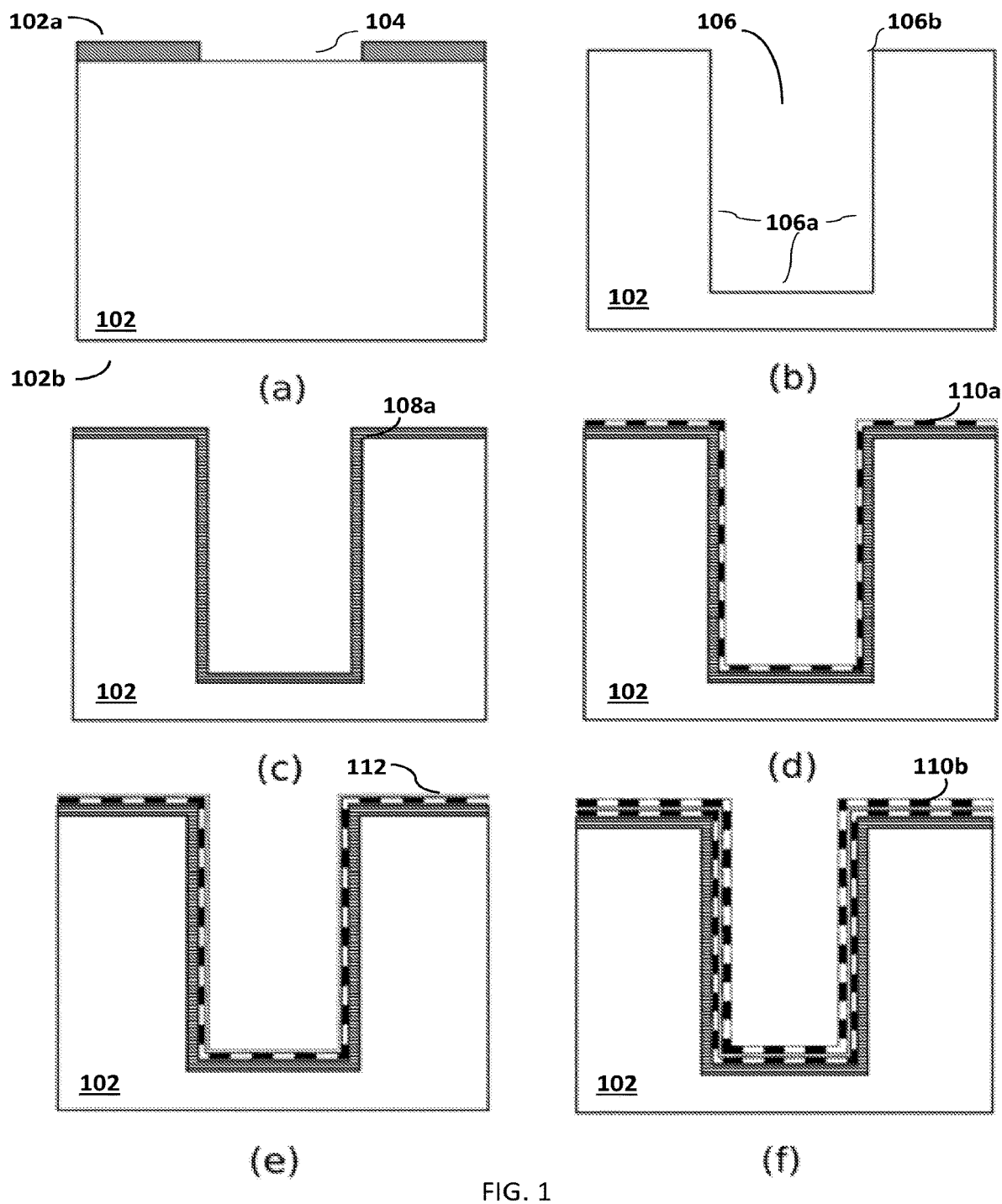
FIG. 1 is a series of diagrams illustrating an exemplary process for the forming of a first semiconductor device.
Figure 1:
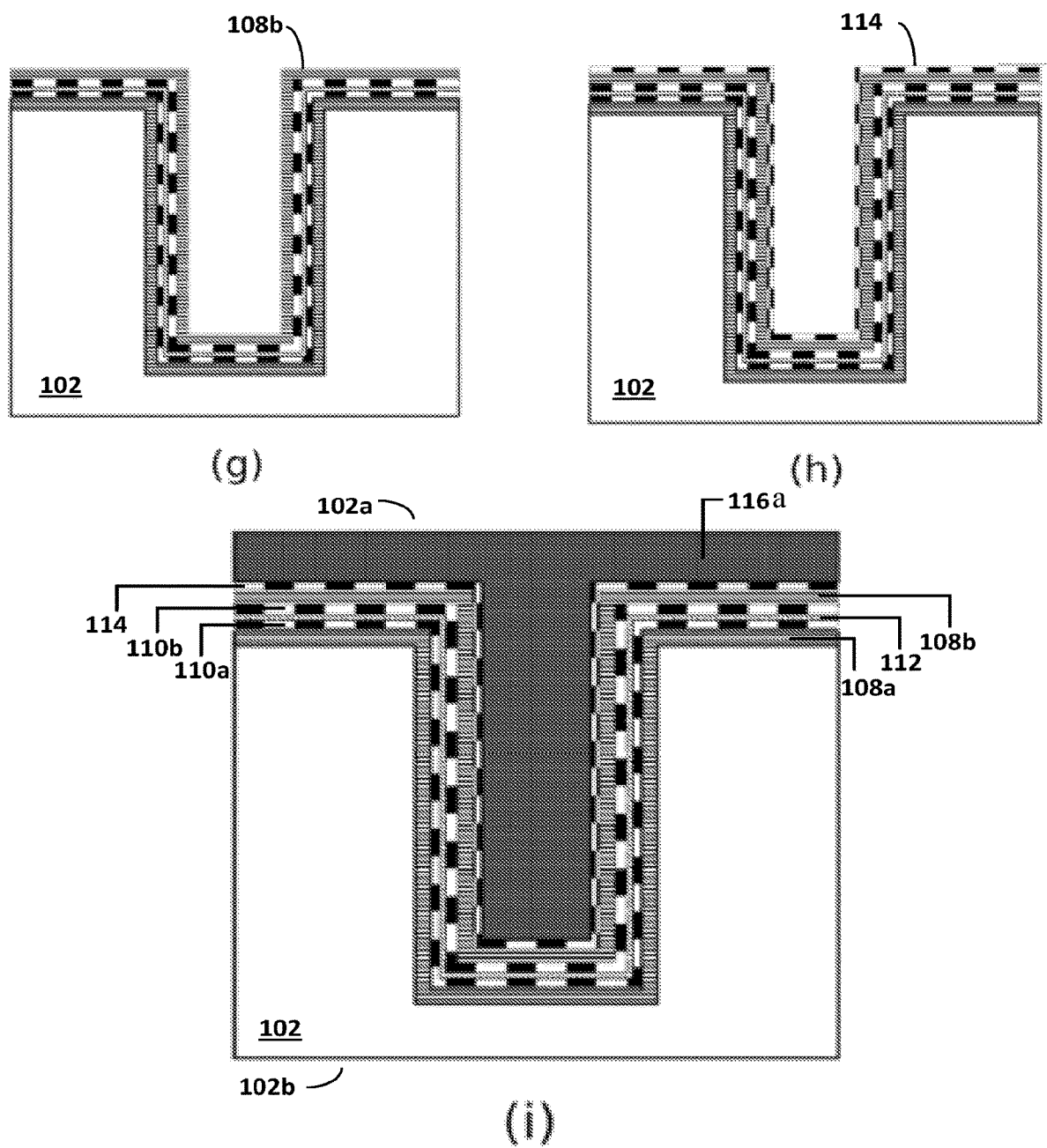
Figure 1:
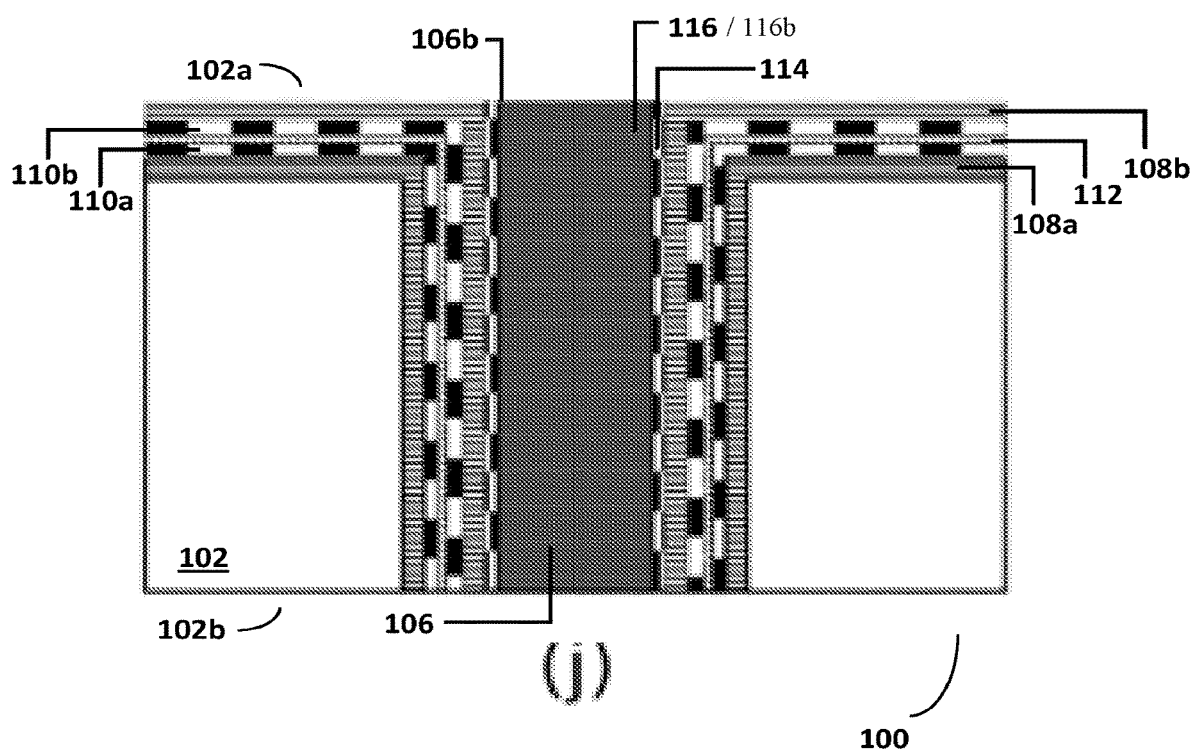

Turning now to FIG. 1 as mentioned above, this provides a series of diagrams illustrating an exemplary process flow for the forming of a first semiconductor device 100. FIG. 1(a) shows a substrate 102 having a first side 102a and a second side 102b. In at least one implementation, substrate 102 is formed, at least partially, from silicon. A window 104 is patterned by photoresist on substrate 102 by, for example lithography. In at least one implementation, the window 104 is of a square or generally square shape. In another implementation, the window 104 is of a circular or generally circular shape. In FIG. 1(b), a trench 106 is formed in the substrate 102. In one example, the trench 106 has a cross-sectional shape corresponding to the shape of the window. Trench 106 has an inside surface 106a. In this example, the inside surface 106a can be the (or each) sidewall and/or the upper surface of the bottom of the trench 106. The trench 106 may be formed by a number of known manufacturing techniques including deep reactive ion etching. Concerning dimensions, the trench 106 may be, for example, between 1 µm and 50 µm in diameter, preferably between, say, 5 µm and 20 µm, 30 µm or 40 µm. In one preferred arrangement, the trench 106 is 10 µm. Preferably, the depth of the trench is between 20 µm and 200 µm, more preferably between 25 µm and 150 µm, yet more preferably between 30 µm and 100 µm, and yet more preferably between 40 µm and 75 µm. In one particularly preferred arrangement, the trench is 50 µm deep.

A first insulation layer 108a is formed on at least part of inside surface 106a. In the exemplary arrangement of FIG. 1(c), first insulation layer 108a is deposited conformally on the or each sidewall and on the upper surface of the bottom of the trench 106. In this example, first insulation layer 108a is formed as a thin layer, not filling the trench 106 completely. Optionally, and as illustrated in this example, insulation layer material is also formed on the upper surface 106b of the first side 102a of substrate 102. A number of different techniques may be used for the forming of the first insulation layer 108a, but one particularly suitable technique is chemical vapour deposition (CVD). A number of materials may be used to form first insulation layer 108a, such as fluorine-doped silicon oxide (SiOF), Carbon Doped Oxide (CDO), Organo Silicate Glass (OSG) and Silicon Oxycarbide (SiOC) but in one preferred arrangement, silicon dioxide ($SiO_2$) is used as the insulating material. The thickness of first insulation layer 108a is preferably between 0.05 µm and 2 µm, and more preferably between 0.1 µm and 1 µm. In one exemplary arrangement, the thickness of the layer is 0.2 µm.

As illustrated in FIG. 1(d), a first conductive layer 110a is formed in the trench. In this example, first conductive layer 110a is formed on top of at least part of first insulation layer 108a. In at least one implementation, the first conductive layer 110a is formed conformally on top of the first insulation layer 108a. In this example, first conductive layer 110a is formed as a thin layer, not filling the trench 106 completely. Optionally, and as illustrated in this example, first conductive layer 110a material is also formed on top of the first insulation layer material 108a formed on the upper surface 106b of the first side 102a of substrate 102. A number of different techniques may be used for the forming of the first conductive layer 110a, but one particularly suitable technique is atomic layer deposition (ALD). Additionally or alternatively, first conductive layer 110a may be formed by sputtering on the structure as shown in FIG. 1(c). As will become apparent, first conductive layer 110a will function as a first capacitor electrode layer. A number of materials may be used to form first conductive layer 110a, such as Tantalum Nitride (TaN), Tungsten (W) or Copper (Cu) but in one preferred arrangement, titanium nitride (TiN) is used as the material for the first conductive layer 110a. The thickness of the layer is preferably between 0.05 µm and 5 µm, and more preferably between 0.075 µm and 2.5 µm. In one exemplary arrangement, the thickness of the layer is 0.1 µm.

Thus, it will be appreciated that FIG. 1(d) illustrates semiconductor device 100 comprising a first insulation layer 108a disposed on an inside surface 106a of the trench 106, the first capacitor electrode layer 110a being disposed on the insulation layer 108a.

As illustrated in FIG. 1(e), a dielectric material layer 112 is formed in the trench 106. In this example, dielectric material layer 112 is formed on top of at least part of first conductive layer 110a. In at least one implementation, dielectric material layer 112 is formed conformally on top of first conductive layer 110a. In this example, dielectric material layer 112 is formed as a thin layer, not filling the trench 106 completely. Optionally, and as illustrated in this example, dielectric material layer 112 is also formed on top of the first conductive layer 110a part formed in the area outside of the trench 106, above upper surface 106b on first side 102a of substrate 102. A number of different techniques may be used for the forming of the dielectric material layer 112, but one particularly suitable technique is ALD. As will become apparent, dielectric material layer 112 will function as a capacitor dielectric. A number of materials may be used to form dielectric material layer 112, but in one exemplary arrangement a high-K dielectric material such as aluminium oxide 112 ($Al_2O_3$) may be used. Alternatively, other materials such as Hafnium (IV) Oxide ($HfO_2$) or Tantalum Pentoxide/tantalum Oxide $Ta_2O_5$) may be used. The thickness of the layer is preferably between 10 nm and 100 nm, more preferably between 20 nm and 75 nm, and yet more preferably between 25 nm and 50 nm. In one exemplary arrangement, the thickness of the dielectric material layer is 30 nm.

In FIG. 1(f), a second conductive layer 110b is formed in the trench 106. In this example, second conductive layer 110b is formed on top of at least part of dielectric material layer 112. In at least one implementation, second conductive layer 110b is formed conformally on top of dielectric material layer 112. In this example, second conductive layer 110b is formed as a thin layer, not filling the trench 106 completely. Optionally, and as illustrated in this example, second conductive layer 110b is also formed on top of the dielectric material layer 112 part formed in the area outside of the trench, above the upper surface 106b of first side 102a of substrate 102. As will become apparent, second conductive layer 110b will function as a second capacitor electrode layer, in conjunction with dielectric material layer 112 and first conductive layer 110a. A number of different techniques may also be used for the forming of the second conductive layer 110b but it may be expedient to use the techniques described above in respect of first conductive layer 110a. The thickness of the layer is preferably between 0.05 µm and 5 µm, more preferably between 0.075 µm and 2.5 µm. In one exemplary arrangement, the second conductive layer 110b is 0.1 µm thick. In one exemplary arrangement, TiN may be used as the first conductive layer. Alternatively, other materials such as Tantalum Nitride (TaN), Tungsten (W) or Copper (Cu) may be used.

The structure of the layers of the first capacitor electrode layer 110a, the dielectric layer 112 and the second capacitor electrode layer 110b as illustrated in FIG. 1(d)-(f) may be repeated one or more times depending on specific application requirements.

As illustrated in FIG. 1(g), a second insulation layer 108b is formed in the trench 106. In this example, second insulation layer 108b is formed on top of at least part of second conductive layer 110b. In at least one implementation, the second insulation layer 108b is formed conformally on top of second conductive layer 110b. In this example, second insulation layer 108b is formed as a thin layer, not filling the trench 106 completely. Optionally, and as illustrated in this example, second insulation layer 108b material is also formed on top of the second conductive layer 110b formed on the upper surface 106b of the first side 102a of substrate 102. A number of different techniques may be used for the forming of the second insulation layer 108b but it may be expedient to use the techniques described above in respect of the first insulation layer 108a.

Thus it will be appreciated that FIG. 1(g) illustrates semiconductor device 100 comprising a second insulation layer 108b disposed on the second capacitor electrode layer 110b.

As illustrated in FIG. 1(h), a barrier layer 114, such as a diffusion barrier layer, is formed in the trench 106. In this example, barrier layer 114 is formed on top of at least part of second insulation layer 108b. In at least one implementation, the barrier layer 114 is formed conformally on top of second insulation layer 108b. In this example, barrier layer 114 is formed as a thin layer, not filling the trench 106 completely. Optionally, and as illustrated in this example, barrier layer 114 material is also formed on top of the second insulation layer 108b formed on the upper surface 106b of the first side 102a of substrate 102. A number of different techniques may also be used for the forming of the barrier layer 114, but one particularly suitable technique is ALD. Additionally or alternatively, barrier layer 114 may be formed by sputtering on the structure shown in FIG. 1(g). A number of materials may be used to form a barrier layer 114, such as Tantalum Nitride (TaN), Titanium (Ti) or Tantalum (Ta). In one exemplary arrangement, TiN is used as the barrier layer material. The thickness of the layer may be between, for example, 10 nm and 200 nm, 20 nm and 150 nm, 30 nm and 100 nm or 40 nm and 75 nm. In one exemplary arrangement, the thickness of the layer is 50 nm.

As illustrated in FIG. 1(i), the trench 106 is filled with conductive material 116a. A number of techniques may be used for the filling of the trench 106, and a number of materials, but the inventors have found that it is particularly useful to use copper as the conductor, and that it may be formed by electroplating. As will become apparent, conductive material 116a will function as a through-substrate via conductor 116. In a preferred implementation, conductive material 116a is arranged as a conductive core 116b, arranged in the centre axis (not marked in the figures) of the trench 106. Preferably, conductive material 116a is arranged concentrically with respect to the centre axis of the trench 106.

In FIG. 1(j), a technique, for example, chemical mechanical polishing (CMP) may be used to planarize at least second side 102b of substrate 102 to expose the conductive material 116a of the via conductive core 116b on the second side 102b. Once the second side 102b is thus planarized, the trench 106 can be considered to have been converted into a through-substrate via hole 106, given the fact the conductive material 116a is now exposed on both first and second side 102a, 102b of substrate 102 for electrical connection thereat. Additionally or alternatively, first side 102a of substrate 102 is planarized to remove the excess conductive material 116a projecting above the upper inner edge 106b of the trench 106. The exemplary TSV with embedded capacitor 100 is formed in FIG. 1(j).

Thus it will be appreciated that FIG. 1 illustrates a semiconductor device 100 comprising a substrate 102 having a through-substrate via hole 106, the through-substrate via hole 106 having formed therein: a first capacitor electrode layer 110a and a second capacitor electrode layer 110b, and a dielectric material layer 112 disposed between the first capacitor electrode layer 110a and the second capacitor electrode layer 110b; and a through-substrate via conductor 116.

It will also be appreciated that FIG. 1 illustrates a method of forming a semiconductor device 100, the semiconductor device 100 comprising a through-substrate via hole 106, the method comprising forming, in the through-substrate via hole 106: a first capacitor electrode layer 110a and a second capacitor electrode layer 110b, and a dielectric material layer 112 disposed between the first capacitor electrode layer 110a and the second capacitor electrode layer 110b; and a through-substrate via conductor 116.

Thus, it will be appreciated that FIG. 1(j) illustrates a semiconductor device 100 comprising the through-substrate via hole 106 having been formed from a trench 106 formed in a first side 102a of the semiconductor substrate 102, the through-substrate via conductor 116 comprising a via conductive core 116b; the first capacitor electrode layer 110a, the dielectric material layer 112 and the second capacitor electrode layer 110b having been formed in the trench 106, and wherein the second capacitor electrode layer 110b surrounds the via conductive core 116b.

It will also be appreciated that FIG. 1(j) illustrates the first capacitor electrode layer 110a, the dielectric material layer 112 and the second capacitor electrode layer 110b being disposed generally as concentric layers surrounding the via conductive core.

Thus it will be appreciated that FIG. 1(j) illustrates semiconductor device 100 comprising a barrier layer 114 disposed on the second insulation layer 108b. It will also be appreciated that barrier layer 114 is formed for the trench 106 to be in an unfilled state, the via conductive core 116b is formed by filling the trench 106 with a conductive material 116a and the through-substrate via hole 106 is formed by planarising a second side 102b of the substrate 102 to expose the conductive material 116a of the via conductive core 116b thereat.

Such techniques offer significant technical advantages, as mentioned above. In particular, by forming the through-substrate via conductor and the capacitor electrode layers 110a, 110b in the same trench 106, significant savings in respect of the footprint of these components may be realised. The capacitor thus formed may be considered a trench capacitor, e.g. a deep trench capacitor. By combining the deep trench capacitor and the through-substrate via conductor together in the same trench/via hole 106, but by keeping their terminal electrodes separate, both the deep trench capacitor and the through-substrate via conductor can function independently as if they were built, conventionally, occupying two separate trenches.

Naturally, such advantages may lead to significant cost reductions, in addition to the space reductions. Further, by simplification of the process flows for the formation of a deep trench capacitor and the through-substrate via conductor, implementation of the techniques disclosed herein may result in fewer processing steps being required.

In the above exemplary techniques, it will be appreciated that several buffering layers—including the capacitor electrode and dielectric layers—are disposed between the substrate 102 itself and the through-substrate via conductor 116. With such an arrangement, any problems which might be caused by thermal-mechanical stresses may be mitigated.

Figure 2A:
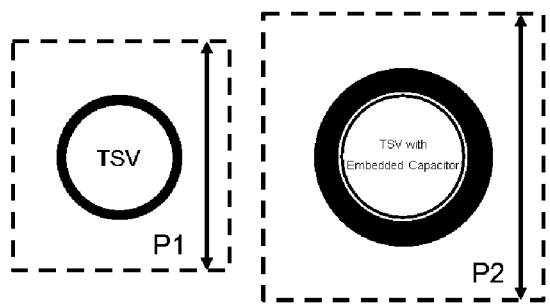
FIG. 2 is a series of diagrams illustrating a conventional TSV and an exemplary TSV with embedded capacitor.

In addition, a higher capacitance density may be realised. FIG. 2(a) shows a conventional TSV when compared with a TSV with embedded capacitor formed in accordance with the techniques described herein. The formation of the through-substrate via conductor 116 and the capacitor electrode layers in the same trench 106 may result in a semiconductor device 100 with a higher capacitance density than a conventional TSV. For instance, it will be seen that the pitch P1 of the conventional TSV is not much greater than the pitch P2 of the TSV with embedded capacitor formed according to the techniques described herein.

Figure 2B:
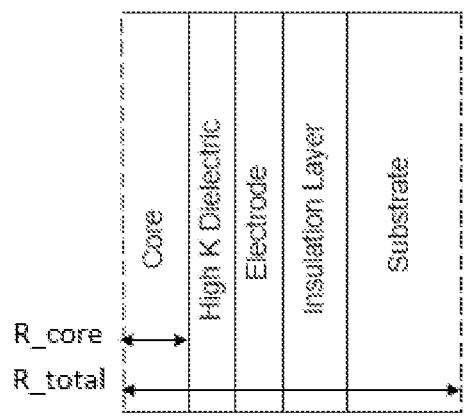

FIG. 2(b) illustrates a construction architecture of a simplified version of the TSV with embedded capacitor. In this arrangement, one insulation layer and one electrode layer may be removed, and the conductive core may serve as the second electrode layer. Also illustrated is the dielectric (in this example, a high-k dielectric) as formed with the other layers on the substrate. R_core denotes the radius of the through-substrate via core and R_total denotes the total radius of the trench.

Figure 2C:
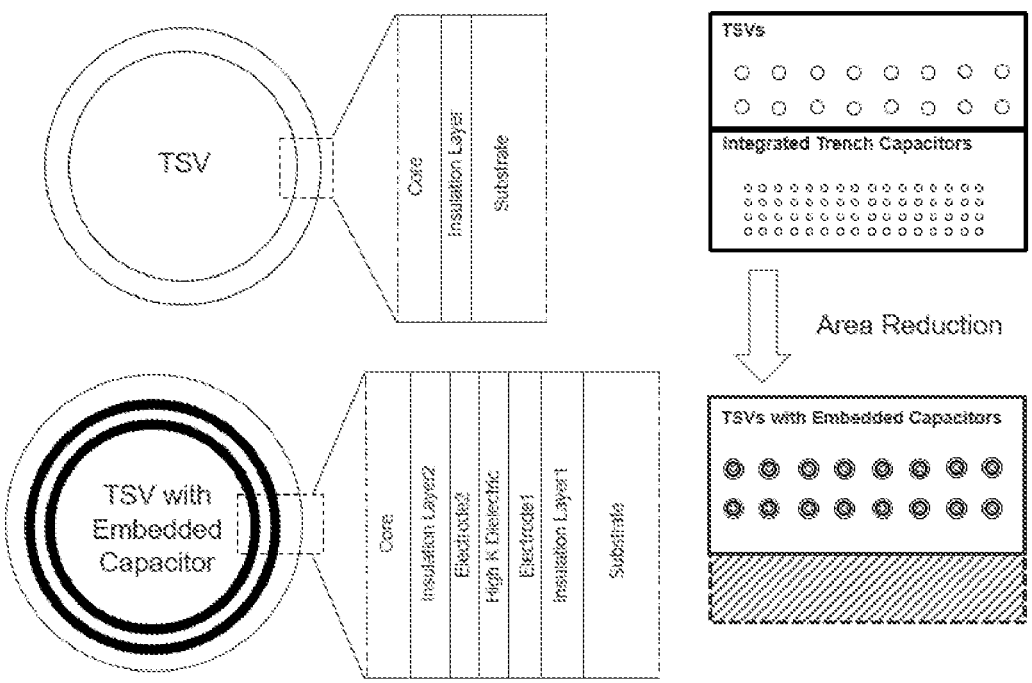

FIG. 2(c) illustrates respective construction architectures of the conventional TSV and the TSV with the embedded capacitor as described herein provided with two electrode layers and two insulation layers. The architecture of the conventional TSV is simply made up from the conductor core and the insulation layer formed on the substrate.

In contrast, the architecture of the TSV with the embedded capacitor formed according to the techniques described herein comprises the layers of (in the direction moving out from the centre): core, second insulation layer, second electrode layer, dielectric layer, first electrode layer, first insulation layer, formed on the substrate.

As also illustrated in FIG. 2(c) the footprint area for forming separate conventional TSVs and separate trench capacitors is greater than the footprint area required for forming a corresponding number of TSVs with embedded capacitors according to the techniques disclosed herein.

Analytical equations have been derived for estimation of capacitance density when different geometries and materials are applied.

$$\text{Effective Capacitance Density} = \frac{C_{MIM}}{P_2^2 - P_1^2}$$

$$C_{MIM} = \frac{2\pi\varepsilon_{highk}\varepsilon_0 \times H}{\ln\left(\frac{\frac{1}{2}D_{core} + T_{highk}}{\frac{1}{2}D_{core}}\right)}$$

$$P_1 = 4 \times \left(\frac{1}{2}D_{core} + T_{oxide}\right)$$

$$P_2 = 4 \times \left(\frac{1}{2}D_{core} + T_{highk} + T_{electrode} + T_{oxide}\right)$$

where:
H: Height/depth of trench
D_core: Diameter of TSV core=2*R_core
T_highk: thickness of high k dielectric layer (which may be, as mentioned above, $Al_2O_3$)
T_oxide: thickness of oxide layer (which may be, as mentioned above, $SiO_2$)
T_electrode: thickness of electrode (which may be, as mentioned above, TiN)

It may be preferable that the core area of the conventional TSV is approximately equal to the core area of the novel TSV/trench capacitor as herein described.

It may be preferable that the pitch of the novel TSV/trench capacitor as herein described is approximately equal to twice the diameter of the TSV/trench capacitor. It is preferable that the coefficient is greater than one, so that neighbouring patterns do not overlap.

Table 1 illustrates some exemplary values for the parameters defined above.

TABLE 1

| | |
|---|---|
| $\varepsilon_{highk}$ | 9 ($Al_2O_3$) |
| $R_{core}$ | 5, 10, 15, 20, 25 μm |

TABLE 1-continued

| | |
|---|---|
| $T_{highk}$ | 30 nm |
| $T_{electrode}$ | 50 nm |
| $T_{oxide}$ | 500 nm |
| H | 50 μm |

Figure 3:
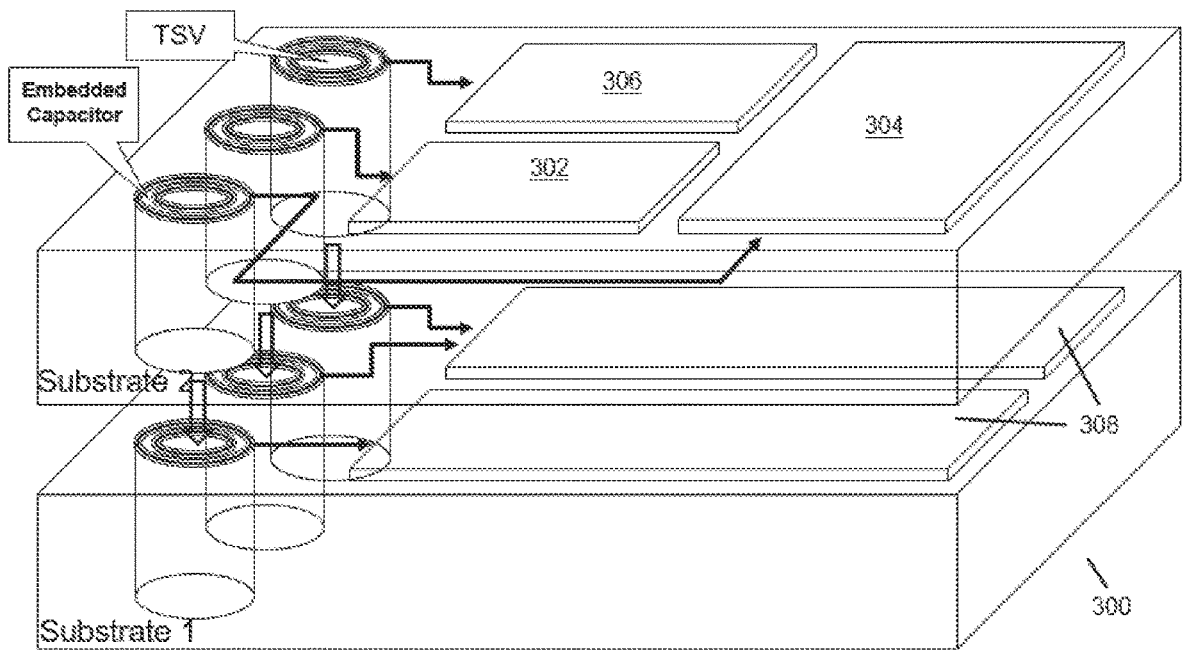
FIG. 3 is a diagram illustrating an exemplary semiconductor chip stack.

FIG. 3 illustrates an exemplary semiconductor substrate ("chip") stack 300 with one or more of the substrates having been formed in accordance with the techniques described with respect to FIG. 1. In the example of FIG. 3, the chip stack 300 comprises a decoupling capacitor module 302 for a power distribution network (PDN) as a large amount of capacitance is required for a low impedance PDN. Chip stack 300 also comprises an integrated voltage regulator module 304. Stable, large value capacitors are required for integration of the power system. Chip stack 300 further comprises a radio frequency circuit module 306, and capacitors with vertical electrical interconnects enable the 3D integration of CMOS-RF chips. Chip stack 300 comprises on-chip energy storage element modules 308. Arrays of on-chip energy storage element modules 308 may provide ultra-high capacitance to store energy.

Figure 4A:
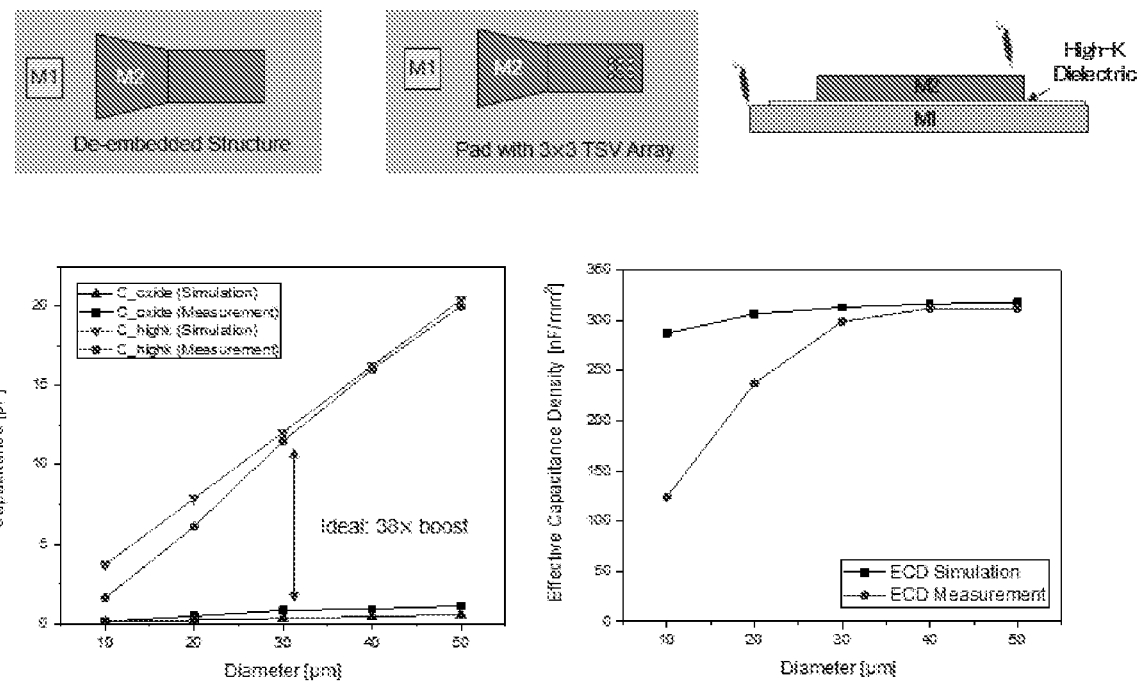
FIG. 4 is a series of diagrams relating to simulation and measurement results of capacitance density and comparison with known techniques.

It can be derived from the simulation and measurement results shown in FIG. 4(a), that if the above exemplary techniques are applied as that of deep trench capacitor, the capacitance density can be further boosted by more than 2 times [1]. It is to be noted that there is a discrepancy between the simulation and measurement values for trench diameters below 30 μm. This may be attributed to reactive ion etching loading effect and/or experiments of trenches with different diameters being conducted on the same wafer. It is preferred for the trenches to have the same depth. Although they may be processed together, the etching chemicals may enter more easily into trenches with larger diameters, so trenches with those larger diameters are etched more quickly than those with smaller diameters. However, in real-life manufacturing situations, the dispersion between modelling and experiments can be eliminated, thus meaning the model remains valid.

Figure 4B:
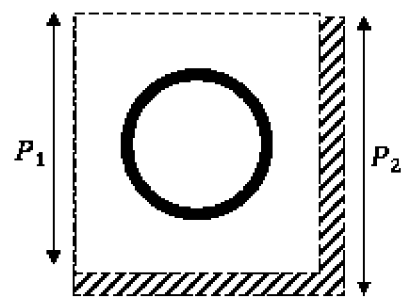

FIG. 4(b) illustrates a superposition of the two pitch sizes P1 and P2 from FIG. 2(a) above. The effective capacitance density of the TSV with embedded capacitor shown in FIG. 4(b) is around 320 nF/mm². A deep trench capacitor [1] has an effective capacitance density of 440 nF/mm². Following the results derived in FIG. 4(a), the effective capacitance density of a TSV with embedded deep trench capacitor may be around 1200 nF/mm². The values from [1] for the specifications for the trench parameters may be compared with the values from Table 1 above for the new TSV/embedded capacitor.

TABLE 2

| | |
|---|---|
| $\varepsilon_{highk}$ | 9 ($Al_2O_3$) |
| $R_{core}$ | 0.75 μm |
| $T_{highk}$ | 10 nm |

TABLE 2-continued

| | |
|---|---|
| $T_{electrode}$ | 20 nm |
| $T_{oxide}$ | 0 |
| H | 30 μm |
| N | 2 |

Figure 5:
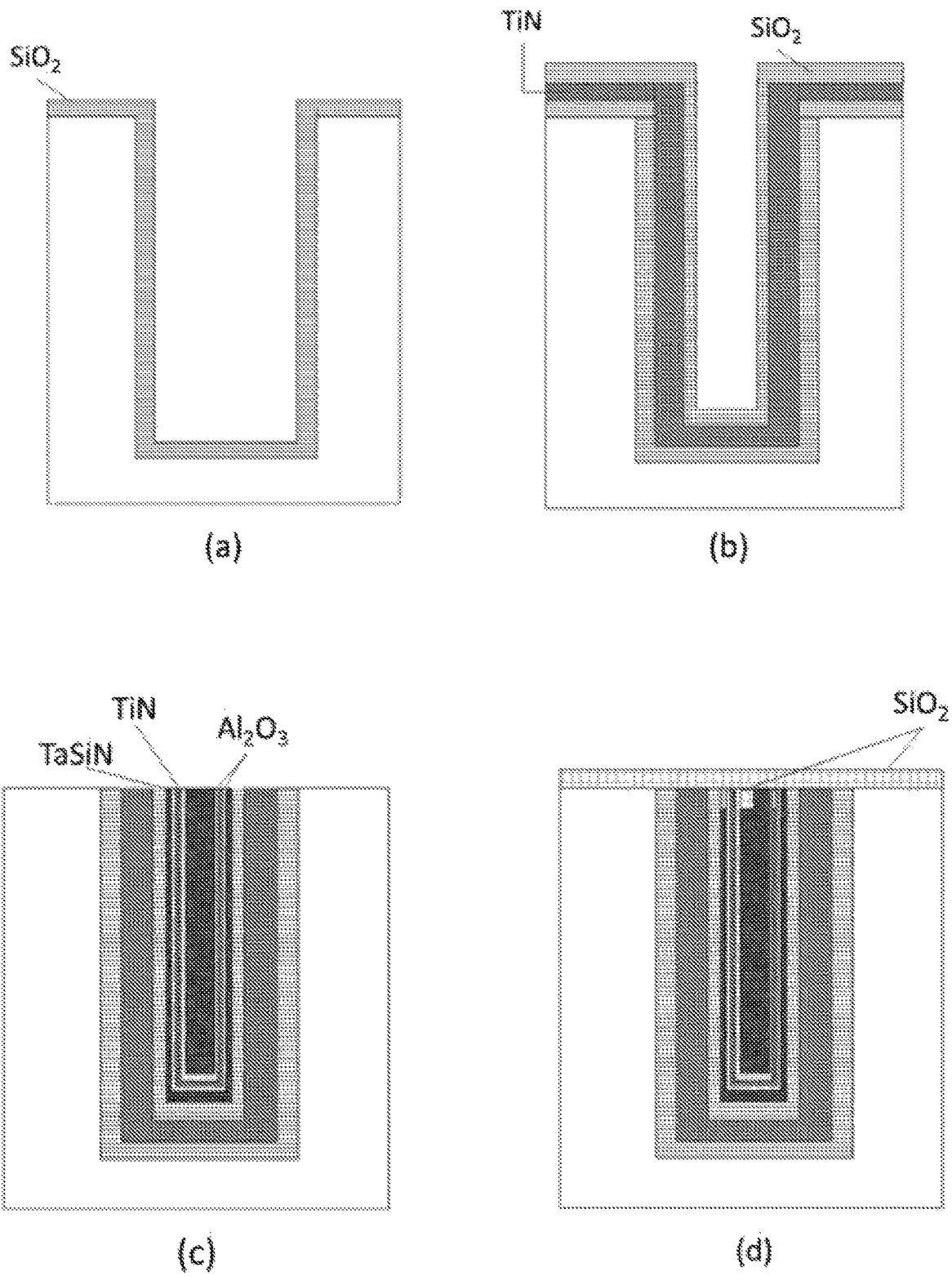
FIG. 5 is a series of diagrams illustrating an exemplary process for the forming of a second semiconductor device.
Figure 5:
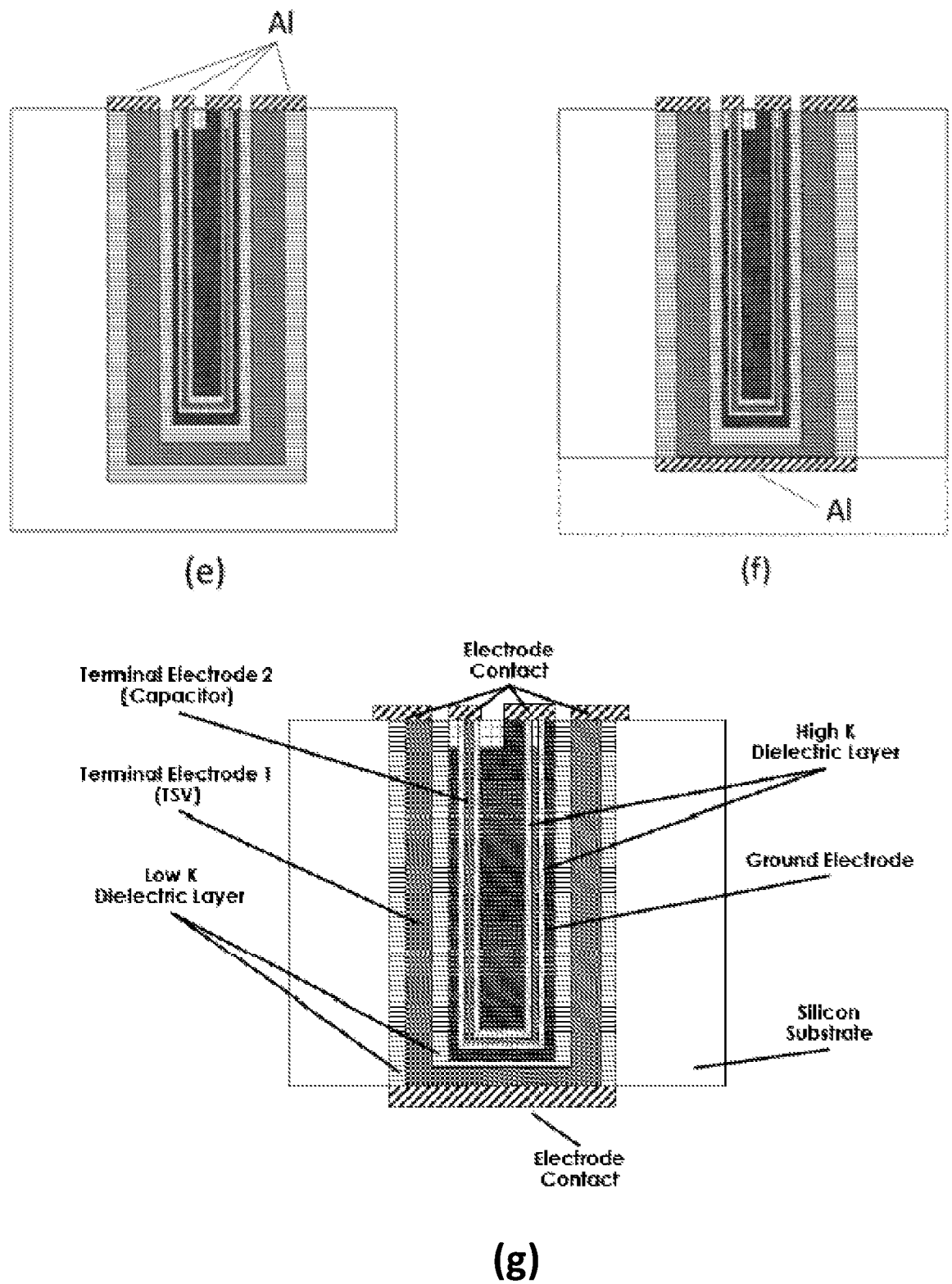

Turning now to FIG. 5, this provides a series of diagrams illustrating the forming of another exemplary semiconductor device 100.

Other techniques are contemplated, where one or more steps listed below are omitted, and/or one or more other process steps are added.

A trench is firstly formed in a silicon substrate, through, for example, lithography and/or etching. It can be 3 μm wide and 30 μm deep.

A low-K dielectric layer can be deposited conformally on sidewalls and bottom of trench by, for example, atomic layer deposition (ALD). $SiO_2$ can be chosen as low-K material and thickness can be 0.1 μm. (FIG. 5a)

A conductive layer can be formed by, for example, ALD on the existing structure. And it may be assigned to be terminal electrode 1. TiN can be chosen as the first conductive layer material and the thickness can be 0.5 μm.

Another low-K dielectric layer can be formed as in FIG. 5(a), which can be 0.1 μm thick $SiO_2$ (FIG. 5b).

A different conductive layer can be deposited by, for example, ALD. TaSiN can be chosen as the second conductive layer material and thickness can be 20 nm.

A thin high-K dielectric layer can be deposited over previous layers. $Al_2O_3$ can be chosen as the high-K material and the thickness can be 10 nm.

A structure of "first conductive layer/high-K/second conductive layer" can be repeated one or more times until the trench is wholly or partially filled.

Chemical mechanical polishing (CMP) can be used to planarize the surface and remove the overburden to expose the substrate surface. (FIG. 5c)

A mask is put on the surface where the first conductive layer is selectively etched by, for example, $SC_2$ and the second conductive layer is selectively etched by, for example, HF.

A $SiO_2$ layer can be deposited to cover one or more of the small trenches. (FIG. 5d) The substrate surface may be exposed by, for example, CMP.

Electrode Contacts, Al, are patterned according to the desired function. (FIG. 5e)

Back-grinding of the substrate may be applied. This can be used, for example, to expose the outer-most conductive layer, perhaps only that layer.

Another electrode contact of Al may be patterned on the back side. (FIG. 5f)

FIG. 5g illustrates the formed semiconductor device. In this arrangement, terminal electrode 1 functions as the through-substrate via conductor, and terminal electrode 2 and the ground electrode together function as the capacitor electrodes.

Figure 6:
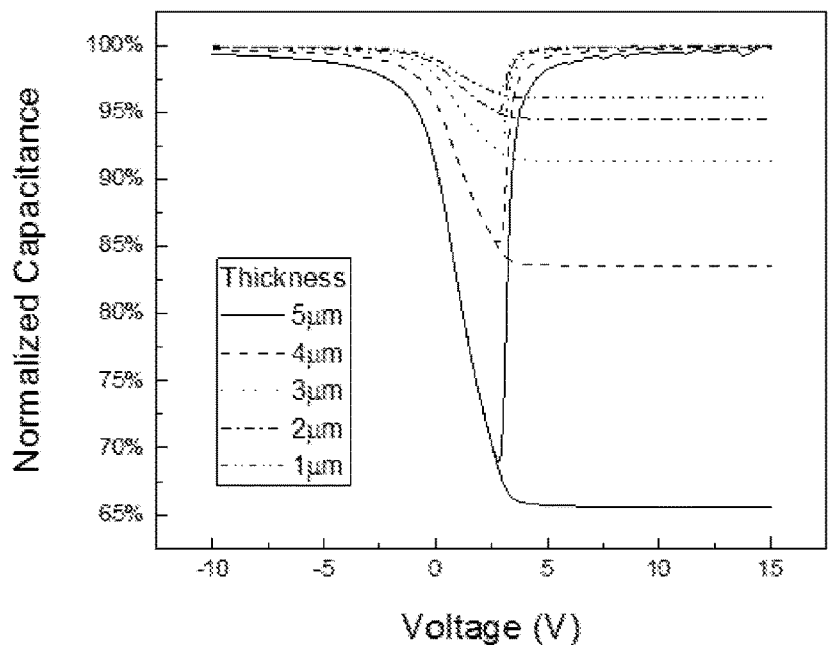
FIG. 6 is a graph illustrating the suppressed capacitance variation with enhanced inner capacitor.

With the above techniques, there may be less TSV capacitance variance. Due to the MOS structure of the conventional TSV, its parasitic capacitance varies under different biasing conditions, which degrades the circuit signal integrity. With the addition of the inner TSV capacitor, a more stable TSV capacitance value can be achieved in all operational regions. As the thickness of copper layer drops from, for example, 5 μm (fully filled) to, for example, 1 μm, its total capacitance increases due to the existence of the inner capacitor, shown in Table 3 and FIG. 6.

TABLE 3

| | | | Stabilized total capacitance | | |
|---|---|---|---|---|---|
| Thickness (μm) | Inner Capacitance (pF) | Original Capacitance Variation | Enhanced Capacitance Variation (Inner Capacitance × 10) | Original Total Capacitance (pF) | Enhanced Total Capacitance (pF) |
| 1 | 0.085 | 19.35% | 3.93% | 0.195 | 0.960 |
| 2 | 0.058 | 22.46% | 5.47% | 0.168 | 0.690 |
| 3 | 0.033 | 26.38% | 8.58% | 0.143 | 0.440 |
| 4 | 0.012 | 30.93% | 16.40% | 0.122 | 0.230 |
| 5 | 0 | 34.30% | 34.30% | 0.110 | 0.110 |

$$\text{Total Capacitance} = C_{outer} + C_{inner}$$

where $C_{outer}$ refers to a MOS capacitor, and $C_{inner}$ is a MIM capacitor. Since the MIM capacitor is not sensitive to biasing conditions, the increase in stable $C_{inner}$ could help mitigate the difference of total capacitance.

Figure 7:
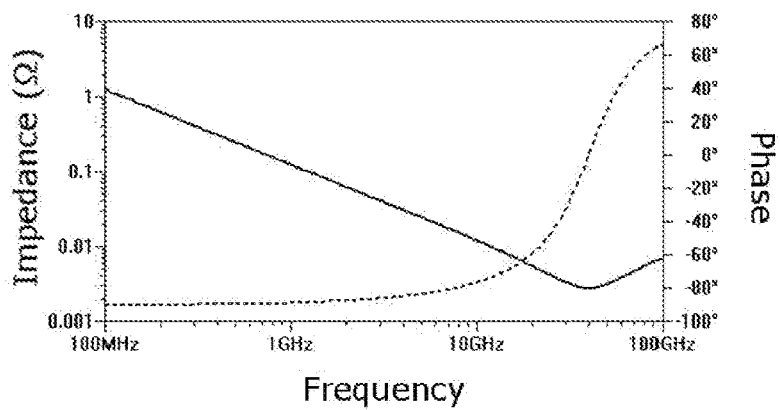
FIG. 7 is a graph illustrating the magnitude and phase of embedded capacitors.

Capacitors may be located nearer to the interconnects, thus less parasitic components are involved. One of the high quality on-chip capacitor applications is to decouple the noise in the power distribution network of integrated circuits. FIG. 7 shows a first curve demonstrating the variation of the impedance of embedded capacitors in TSV with respect to frequency, which can exhibit capacitive component behaviour even beyond 10 GHz. FIG. 7 also shows a second curve demonstrating the variation of phase with respect to frequency.

Figure 8:
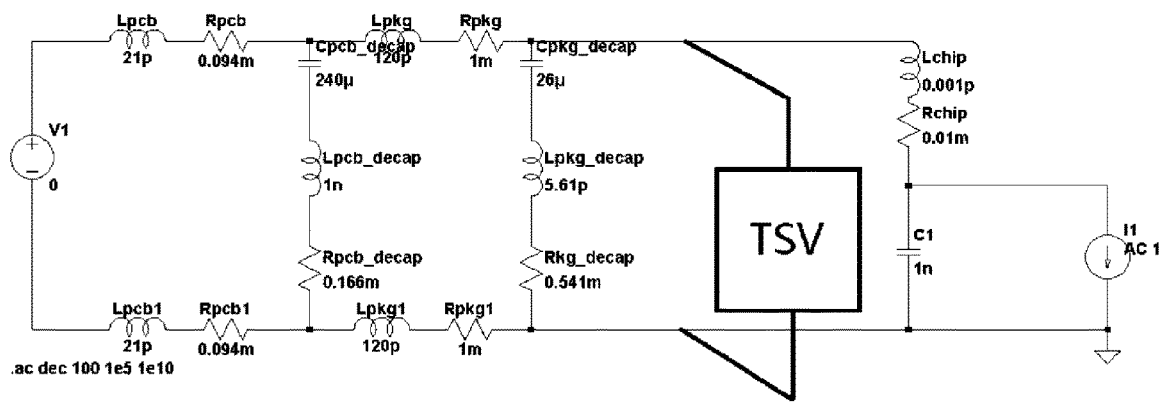
FIG. 8 is a diagram illustrating the SPICE model of power distribution network (PDN)
Figure 9:
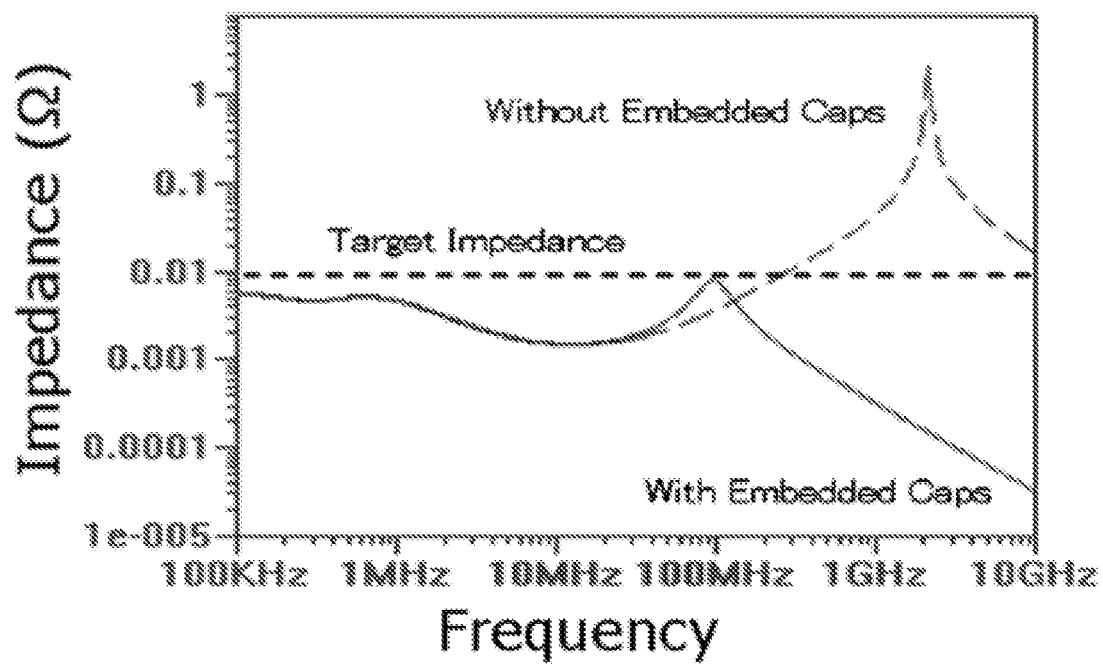
FIG. 9 is a graph illustrating the Impedance reduction due to embedded capacitors.

Arrays of TSVs may be inserted in the power distribution networks, as shown in FIG. 8. FIG. 9 shows that an 8Ω impedance peak at 3 GHz can be suppressed to achieve a target impedance level as low as 0.01 Ω in SPICE simulation.

Figure 11:
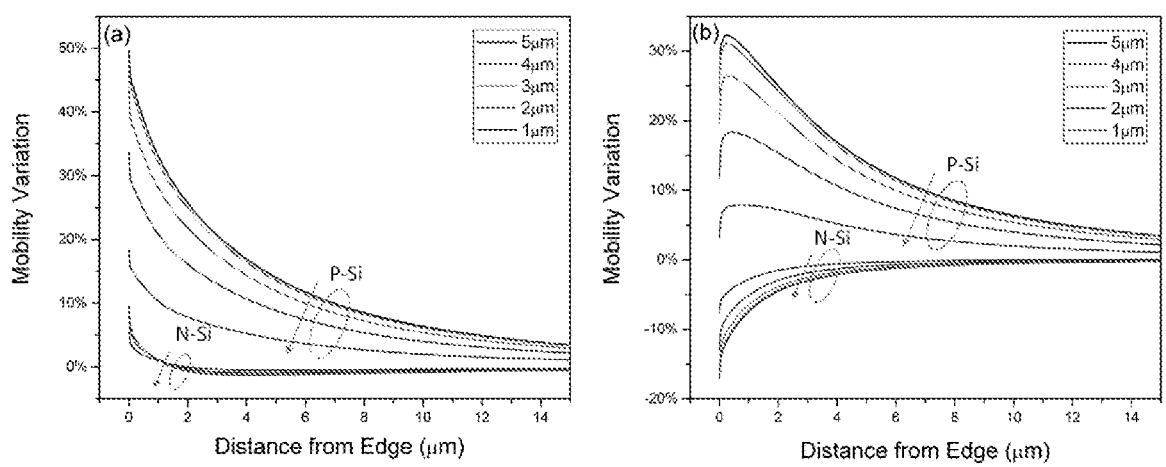
FIG. 11 is a series of graphs illustrating suppressed mobility variation of transistors towards TSV.
Figure 10:
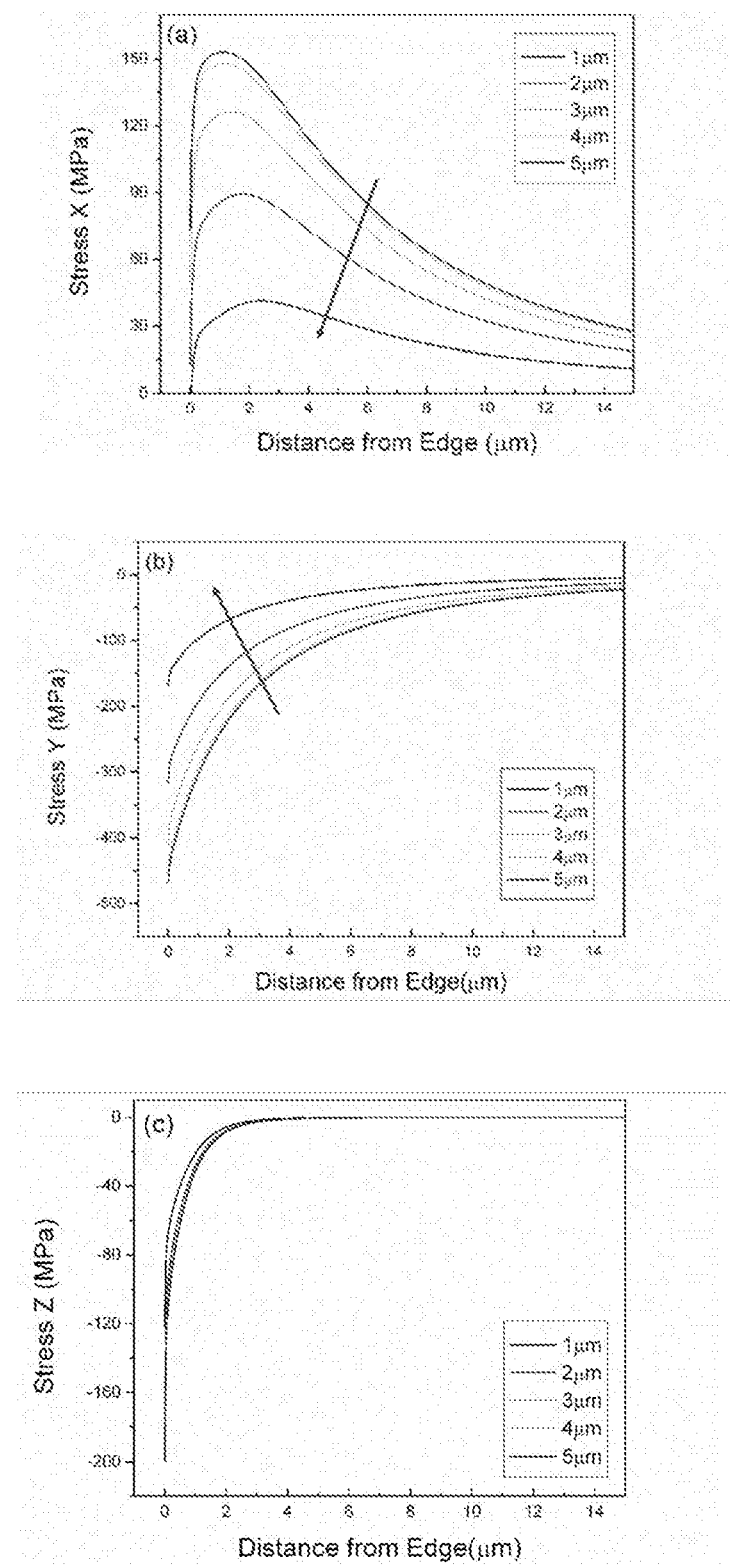
FIG. 10 is a series of graphs illustrating normal stress components along X, Y, Z directions compared with decreasing copper layer thickness.

Normal stress components along the X, Y, Z directions are compared in FIG. 10 with decreasing copper layer thickness. In addition, FIG. 11 shows that transistors are also less affected by the piezo-resistive effect due to stress in Cu TSVs.

It will be appreciated that the invention has been described by way of example only and that various modifications may be made to the techniques described above without departing from the spirit and scope of the invention.

REFERENCE

1. J. Klootwijk, K. Jinesh, W. Dekkers, J. Verhoeven, F. van den Heuvel, H. Kim, D. Blin, M. Verheijen, R. Weemaes, M. Kaiser, J. Ruigrok, and F. Roozeboom, "Ultrahigh Capacitance Density for Multiple ALD-Grown MIM Capacitor Stacks in 3-D Silicon", *IEEE Electron Device Lett.*, vol. 29, no. 7, pp. 740-742, 2008.

The invention claimed is:

1. A semiconductor device comprising a substrate having a through-substrate via hole, the through-substrate via hole having formed therein:
    a capacitor comprising:
       a first capacitor electrode layer and a second capacitor electrode layer, and
       a dielectric material layer disposed between the first capacitor electrode layer and the second capacitor electrode layer;
    a through-substrate via conductor, wherein the second capacitor electrode layer is disposed between the first capacitor electrode layer and the through-substrate via conductor, the through-substrate via hole having been formed from a trench formed in a first side of the substrate, the through-substrate via conductor comprising a via conductive core; the first capacitor electrode layer, the dielectric material layer and the second capacitor electrode layer having been formed in the trench, and wherein the second capacitor electrode layer surrounds the via conductive core;
    an insulation layer disposed on the second capacitor electrode layer and in between the second capacitor electrode layer and the through-substrate via conductor, the insulation layer being the only layer of a dielectric material arranged between the second capacitor electrode layer and the through-substrate via conductor; and
    a further insulation layer disposed on an inside surface of the trench, the first capacitor electrode layer being disposed on the further insulation layer,
    wherein the capacitor and the through-substrate via conductor are electrically isolated from one another.

2. The semiconductor device of claim 1, wherein the semiconductor device comprises a barrier layer disposed on the insulation layer that is disposed on the second capacitor electrode layer.

3. The semiconductor device of claim 2, the barrier layer having been formed for the trench to be in an unfilled state, the via conductive core having been formed by filling the trench with a conductive material and the through-substrate via hole having been formed by planarising a second side of the substrate to expose the conductive material of the via conductive core thereat.

4. A method of forming a semiconductor device, the semiconductor device comprising a substrate having a through-substrate via hole, the method comprising forming, in the through-substrate via hole:
    a capacitor comprising:
       a first capacitor electrode layer and a second capacitor electrode layer, and
       a dielectric material layer disposed between the first capacitor electrode layer and the second capacitor electrode layer; and
    a through-substrate via conductor, wherein the second capacitor electrode layer is disposed between the first capacitor electrode layer and the through-substrate via conductor,
    the through-substrate via hole having been formed from a trench formed in a first side of the substrate, the through-substrate via conductor comprising a via conductive core, the first capacitor electrode layer, the dielectric material layer and the second capacitor electrode layer having been formed in the trench, wherein the second capacitor electrode layer surrounds the via conductive core, and wherein the first capacitor electrode layer, the dielectric material layer and the second capacitor electrode layer are disposed generally as concentric layers surrounding the via conductive core, wherein the capacitor and the through-substrate via conductor are electrically isolated from one another, wherein the method further comprises:

forming an insulation layer disposed on the second capacitor electrode layer and in between the second capacitor electrode layer and the through-substrate via conductor, the insulation layer being the only layer of a dielectric material arranged between the second capacitor electrode layer and the through-substrate via conductor; and forming a further insulation layer disposed on an inside surface of the trench, the first capacitor electrode layer being disposed on the further insulation layer.

5. A semiconductor device comprising a substrate having a through-substrate via hole, the through-substrate via hole having formed therein:

a capacitor comprising:

a first capacitor electrode layer and a second capacitor electrode layer, and a dielectric material layer disposed between the first capacitor electrode layer and the second capacitor electrode layer;

a through-substrate via conductor, wherein the second capacitor electrode layer is disposed between the first capacitor electrode layer and the through-substrate via conductor, the through-substrate via hole having been formed from a trench formed in a first side of the substrate, the through-substrate via conductor comprising a via conductive core; the first capacitor electrode layer, the dielectric material layer and the second capacitor electrode layer having been formed in the trench, wherein the second capacitor electrode layer surrounds the via conductive core, and wherein the first capacitor electrode layer, the dielectric material layer and the second capacitor electrode layer are disposed generally as concentric layers surrounding the via conductive core;

an insulation layer disposed on the second capacitor electrode layer and in between the second capacitor electrode layer and the through-substrate via conductor, the insulation layer being the only layer of a dielectric material arranged between the second capacitor electrode layer and the through-substrate via conductor; and a further insulation layer disposed on an inside surface of the trench, the first capacitor electrode layer being disposed on the further insulation layer, wherein the capacitor and the through-substrate via conductor are electrically isolated from one another.

6. A semiconductor device comprising a substrate having a through-substrate via hole, the through-substrate via hole having formed therein:

a first capacitor electrode layer and a second capacitor electrode layer, and a dielectric material layer disposed between the first capacitor electrode layer and the second capacitor electrode layer; and a through-substrate via conductor, the through-substrate via hole having been formed from a trench formed in a first side of the substrate, the through-substrate via conductor comprising a via conductive core, the first capacitor electrode layer, the dielectric material layer and the second capacitor electrode layer having been formed in the trench, and wherein the second capacitor electrode layer surrounds the via conductive core, and the first capacitor electrode layer, the dielectric material layer and the second capacitor electrode layer being disposed generally as concentric layers surrounding the via conductive core, wherein the semiconductor device further comprises:

a first insulation layer disposed on an inside surface of the trench, the first capacitor electrode layer being disposed on the first insulation layer, a second insulation layer disposed on the second capacitor electrode layer; and a barrier layer disposed on the second insulation layer.

7. A semiconductor device comprising a substrate having a through-substrate via hole, the through-substrate via hole having formed therein:

a first capacitor electrode layer and a second capacitor electrode layer, and a dielectric material layer disposed between the first capacitor electrode layer and the second capacitor electrode layer; and a through-substrate via conductor, the through-substrate via hole having been formed from a trench formed in a first side of the substrate, the through-substrate via conductor comprising a via conductive core, the first capacitor electrode layer, the dielectric material layer and the second capacitor electrode layer having been formed in the trench, and wherein the second capacitor electrode layer surrounds the via conductive core, and wherein the semiconductor device further comprises:

a first insulation layer disposed on an inside surface of the trench, the first capacitor electrode layer being disposed on the first insulation layer, a second insulation layer disposed on the second capacitor electrode layer; and a barrier layer disposed on the second insulation layer.

8. A semiconductor device comprising a substrate having a through-substrate via hole, the through-substrate via hole having formed therein:

a capacitor comprising:

a first capacitor electrode layer and a second capacitor electrode layer, and a dielectric material layer disposed between the first capacitor electrode layer and the second capacitor electrode layer; and a through-substrate via conductor, wherein the capacitor and the through-substrate via conductor are electrically isolated from one another, the through-substrate via hole having been formed from a trench formed in a first side of the substrate, the through-substrate via conductor comprising a via conductive core; the first capacitor electrode layer, the dielectric material layer and the second capacitor electrode layer having been formed in the trench, and wherein the second capacitor electrode layer surrounds the via conductive core, wherein the semiconductor device further comprises:

a first insulation layer disposed on an inside surface of the trench, the first capacitor electrode layer being disposed on the first insulation layer, a second insulation layer disposed on the second capacitor electrode layer; and a barrier layer disposed on the second insulation layer.

9. The semiconductor device of claim 8, the first capacitor electrode layer, the dielectric material layer and the second capacitor electrode layer being disposed generally as concentric layers surrounding the via conductive core.

10. The semiconductor device of claim 8, the barrier layer having been formed for the trench to be in an unfilled state, the via conductive core having been formed by filling the trench with a conductive material and the through-substrate via hole having been formed by planarising a second side of the substrate to expose the conductive material of the via conductive core thereat.

\* \* \* \* \*